(12) United States Patent
Yoo et al.

(10) Patent No.: US 8,722,435 B2
(45) Date of Patent: May 13, 2014

(54) LIGHT EMITTING DEVICE PACKAGE AND METHOD OF MANUFACTURING THE SAME

(71) Applicant: Samsung Electronics Co., Ltd., Suwon-si (KR)

(72) Inventors: Cheol Jun Yoo, Chungcheongnam-do (KR); Young Hee Song, Gyeonggi-do (KR); Seong Deok Hwang, Seoul (KR); Sang Hyun Lee, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 14/058,152

(22) Filed: Oct. 18, 2013

(65) Prior Publication Data

US 2014/0045286 A1 Feb. 13, 2014

Related U.S. Application Data

(62) Division of application No. 13/328,864, filed on Dec. 16, 2011, now Pat. No. 8,587,010.

(30) Foreign Application Priority Data

Dec. 24, 2010 (KR) .................. 10-2010-0134474

(51) Int. Cl.
*H01L 21/00* (2006.01)
(52) U.S. Cl.
USPC ............................................. 438/27
(58) Field of Classification Search
USPC ............................................. 438/27
See application file for complete search history.

(56) References Cited

U.S. PATENT DOCUMENTS

| | | | |
|---|---|---|---|
| 6,791,116 B2 | 9/2004 | Takahashi et al. | |
| 7,381,996 B2 | 6/2008 | Hsin Chen | |
| 7,642,563 B2 * | 1/2010 | Kang et al. | 257/99 |
| 2001/0000622 A1 | 5/2001 | Reeh et al. | |
| 2002/0145152 A1 | 10/2002 | Shimomura | |
| 2004/0217369 A1 | 11/2004 | Nitta et al. | |
| 2004/0256630 A1 * | 12/2004 | Cao | 257/98 |
| 2005/0236639 A1 | 10/2005 | Abe et al. | |
| 2006/0138443 A1 | 6/2006 | Fan et al. | |
| 2007/0126020 A1 | 6/2007 | Lin et al. | |
| 2007/0205425 A1 | 9/2007 | Harada | |
| 2007/0210325 A1 | 9/2007 | Park et al. | |
| 2008/0023721 A1 | 1/2008 | Lee et al. | |

(Continued)

FOREIGN PATENT DOCUMENTS

KR 10-2006-0124511 A 12/2006
KR 10-2010-0027249 A 3/2010

*Primary Examiner* — Yu-Hsi D Sun
*Assistant Examiner* — Grant Withers
(74) *Attorney, Agent, or Firm* — McDermott Will & Emery LLP

(57) ABSTRACT

Provided is a light emitting device package including: a plurality of lead frames disposed to be separated from one another; at least one light emitting device mounted on the lead frames and electrically connected to the lead frames through a bonding wire provided on a wire bonding pad, the wire bonding pad being disposed on the same surface as a light emission surface provided as an upper surface of the light emitting device; a body part formed to encapsulate and support the wire bonding pad, the bonding wire, the light emitting device and the lead frames, and having a reflective groove formed in an upper surface thereof to expose the light emission surface to the outside therethrough; and a lens part disposed on the body part, to cover the light emitting device.

7 Claims, 14 Drawing Sheets

(56) References Cited

U.S. PATENT DOCUMENTS

| | | |
|---|---|---|
| 2008/0073662 A1 | 3/2008 | Wang et al. |
| 2008/0149958 A1 | 6/2008 | Reeh et al. |
| 2008/0191620 A1 | 8/2008 | Moriyama et al. |
| 2008/0224162 A1 | 9/2008 | Min et al. |
| 2008/0237626 A1 | 10/2008 | Huang et al. |
| 2008/0303052 A1 | 12/2008 | Lee et al. |
| 2009/0045421 A1 | 2/2009 | Ho et al. |
| 2009/0057698 A1 | 3/2009 | Okamura et al. |
| 2009/0134414 A1 | 5/2009 | Li et al. |
| 2010/0084673 A1 | 4/2010 | Ho |
| 2010/0193821 A1 | 8/2010 | Fukasawa et al. |
| 2010/0276720 A1 | 11/2010 | MacElwee et al. |
| 2011/0001157 A1 | 1/2011 | McKenzie et al. |
| 2011/0068358 A1* | 3/2011 | Kuo et al. ............ 257/98 |
| 2011/0204400 A1 | 8/2011 | Koizumi et al. |
| 2011/0233579 A1 | 9/2011 | Loh et al. |
| 2011/0241028 A1 | 10/2011 | Park et al. |
| 2012/0012879 A1 | 1/2012 | Loh et al. |
| 2012/0032223 A1 | 2/2012 | Bae et al. |
| 2012/0037944 A1 | 2/2012 | Takine |
| 2012/0086039 A1 | 4/2012 | Won et al. |
| 2012/0091493 A1 | 4/2012 | Lin et al. |
| 2012/0205708 A1* | 8/2012 | Yoo et al. ............ 257/99 |
| 2012/0273820 A1* | 11/2012 | Lin et al. ............ 257/98 |
| 2012/0326193 A1 | 12/2012 | Park et al. |

* cited by examiner

LIGHT EMITTING DEVICE PACKAGE AND METHOD OF MANUFACTURING THE SAME

CROSS-REFERENCE TO RELATED APPLICATIONS

This application is a Divisional of U.S. application Ser. No. 13/328,864 filed on Dec. 16, 2011, which claims the priority of Korean Patent Application No. 10-2010-0134474 filed on Dec. 24, 2010, in the Korean Intellectual Property Office, the disclosures of which Applications are incorporated by reference herein.

BACKGROUND OF THE INVENTION

1. Field of the Invention

The present invention relates to a light emitting device package and a method of manufacturing the same.

2. Description of the Related Art

In general, a light emitting device package containing a light emitting diode (LED) in which a light emission operation is performed in response to an electrical signal is widely used in various kinds of electronic products including a mobile communications terminal such as a personal mobile phone, a personal digital assistant (PDA), or the like.

A package structure, according to the related art, having an LED installed therein, generally has a cup-shaped cavity formed in a package body thereof formed of a highly reflective material to reduce light loss in light emitted from a light emitting device and has the cavity filled with a silicon-based resin after mounting a light emitting device chip within the cavity.

In particular, since an encapsulant part to encapsulate and protect a wire connecting a chip to a lead generally has a composition in which a fluorescent substance is dispersed in a silicon resin, there may be difficulties in securing the bonding reliability of a wire in a high temperature and high humidity environment, due to a relatively weak bonding force and the deterioration of the mechanical and physical properties of the silicon resin.

In addition, according to the related art, since a package body may be formed through a pre-molding method in which a mold is previously formed in lead frames, the periphery of a chip to later be mounted may not be encapsulated by a mold material, and a color quality of emitted light may be degraded depending on a fluorescent substance density in an upper part and the side surface of the chip due to an approximately 20%~30% emission of light through the side surface of the chip.

SUMMARY OF INVENTION

An aspect of the present invention provides a light emitting device package and a method of manufacturing the same, in which a molding material having a relatively high reflectivity may be used in encapsulating the periphery of a chip in a post molding process in which a molding process is performed after chip bonding and wire bonding processes so as to form a package body, thereby obtaining significantly increased light extraction efficiency by preventing light from being emitted sidewardly and ensuring the light is emitted in an upward direction through internal reflection, and providing light having a uniform color quality through a fluorescent substance layer having a uniform thickness formed on a chip.

Another aspect of the present invention provides a light emitting device package and a method of manufacturing the same, which is capable of enhancing the reliability in a bonding force with a wire by encapsulating a chip and the wire by using a molding material having prominent mechanical, electrical and physical properties instead of using an encapsulating material.

According to an aspect of the present invention, there is provided a light emitting device package including: a plurality of lead frames disposed to be separated from one another; at least one light emitting device mounted on the lead frames and electrically connected to the lead frames through a bonding wire provided on a wire bonding pad, the wire bonding pad being disposed on the same surface as a light emission surface provided as an upper surface of the light emitting device; a body part formed to encapsulate and support the wire bonding pad, the bonding wire, the light emitting device and the lead frames, and having a reflective groove formed in an upper surface thereof to expose the light emission surface to the outside therethrough; and a lens part disposed on the body part, to cover the light emitting device.

The body part may be formed to encapsulate the bonding wire, a side surface of the light emitting device, and a portion of an upper surface of the light emitting device, including the wire bonding pad.

In addition, the wire bonding pad may be disposed in plural at an edge of the upper surface of the light emitting device.

The light emitting device package may further include an encapsulant part formed in the reflective groove to cover the light emission surface.

The encapsulant part may contain any one of a fluorescent material, a diffusion material and a mixture thereof.

The light emitting device package may further include a fluorescent substance layer formed on the light emission surface of the light emitting device.

The light emitting device package may further include a heat dissipating unit disposed in a lower part of the light emitting device and disposed to be exposed to a lower part of the body part so as to discharge heat produced by the light emitting device to the outside.

According to another aspect of the present invention, there is provided a method of manufacturing a light emitting device package including: preparing a light emitting device provided with a wire bonding pad attached to the same surface as a light emission surface provided as an upper surface of the light emitting device; mounting at least one light emitting device on a plurality of lead frames disposed to be separated from one another; electrically connecting the light emitting device to the lead frames by bonding one end of the bonding wire to the wire bonding pad and bonding the other end thereof to the lead frame; forming a body part through a molding process to encapsulate the light emitting device mounted on the lead frames together with the bonding wires by injecting a resin into a mold, the body part being formed to have a reflective groove formed in an upper surface thereof to expose the light emission surface therethrough; and forming a lens part on the body part to cover the light emitting device.

The method of manufacturing a light emitting device package may further include arranging a frame sheet on which the plurality of lead frames are formed to be separated from one another, before the mounting of the light emitting device.

In addition, the method may further include bonding a heat dissipating unit to a lower surfaces of the lead frames on which the light emitting device is mounted, such that the heat dissipating unit may be disposed at a lower part of the light emitting device, before the forming of the body part. The heat dissipating unit may be exposed to a lower part of the body part to be formed later.

The forming of the body part may be performed to encapsulate the bonding wire and a side surface of the light emitting device, and a portion of the upper surface of the light emitting device, including the wire bonding pad, through the molding process.

Further, the forming of the body part may be performed to dispose a single light emitting device in the reflective groove or a plurality of light emitting devices therein through the molding process.

In addition, the method may further include forming a fluorescent substance layer on the light emission surface of the light emitting device between the forming of the body part and the forming of the lens part.

The method may further include dicing along a cutting line so as to form separate light emitting device packages.

BRIEF DESCRIPTION OF DRAWINGS

The above and other aspects, features and other advantages of the present invention will be more clearly understood from the following detailed description taken in conjunction with the accompanying drawings, in which.

DETAILED DESCRIPTION OF PREFERRED EMBODIMENT

Figure 1:
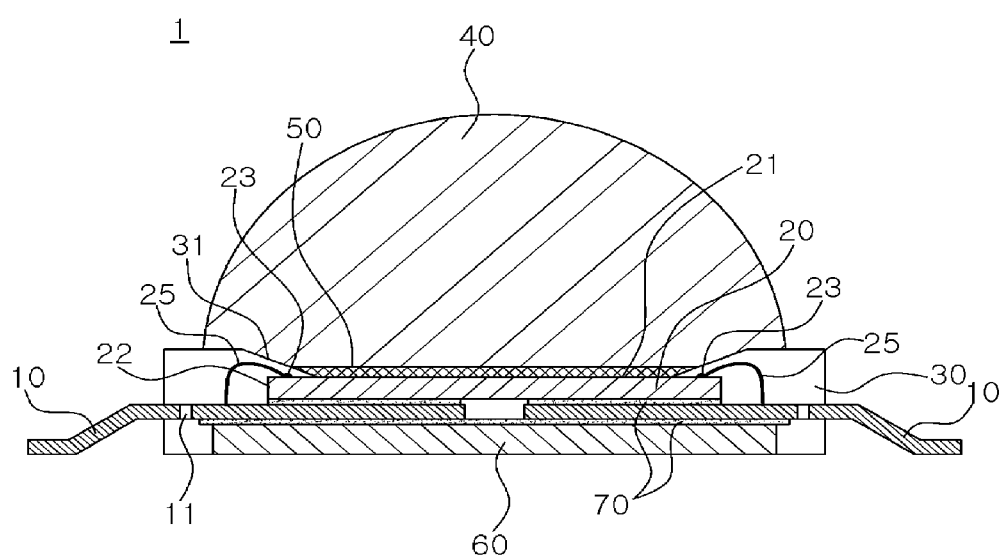
FIG. 1 is a cross-sectional view of a light emitting device package according to an embodiment of the present invention.

Exemplary embodiments of the present invention will now be described in detail with reference to the accompanying drawings such that they could be easily practiced by those having skill in the art to which the present invention pertains. However, in describing the exemplary embodiments of the present invention, detailed descriptions of well-known functions or constructions will be omitted so as not to obscure the description of the present invention with unnecessary detail.

In addition, like reference numerals denote like elements throughout the drawings.

Unless explicitly described to the contrary, the word "comprise" and variations such as "comprises" or "comprising," will be understood to imply the inclusion of stated elements but not the exclusion of any other elements.

According to an embodiment of the present invention, a light emitting device package will be described with reference to FIGS. 1 to 4.

Figure 2A:
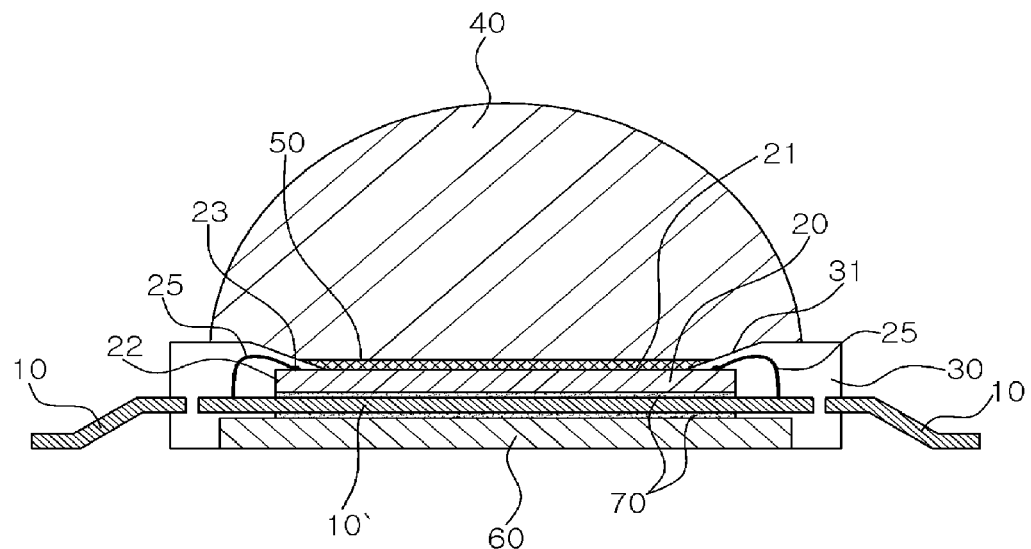
FIGS. 2A and 2B are cross-sectional views of a light emitting device package according to another embodiment of the present invention.
Figure 2B:
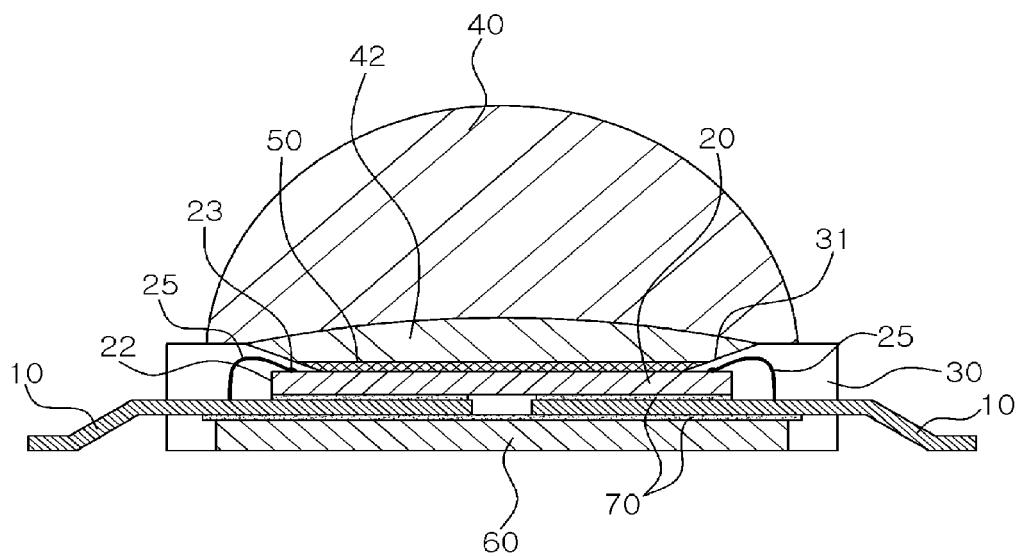
Figure 3A:
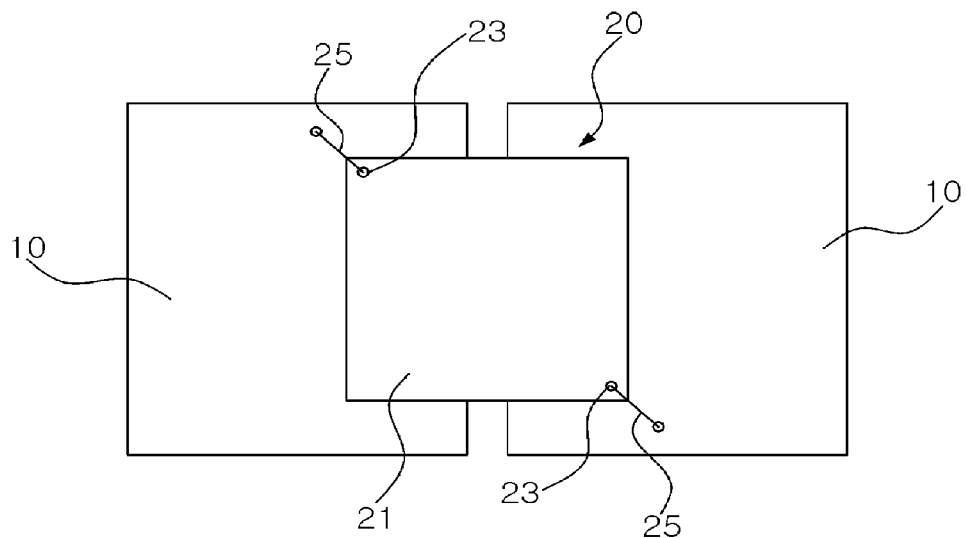
FIG. 3A is a diagram of a light emitting device disposed on the lead frames shown in FIG. 1 to be connected thereto using a bonding wire.
Figure 3B:
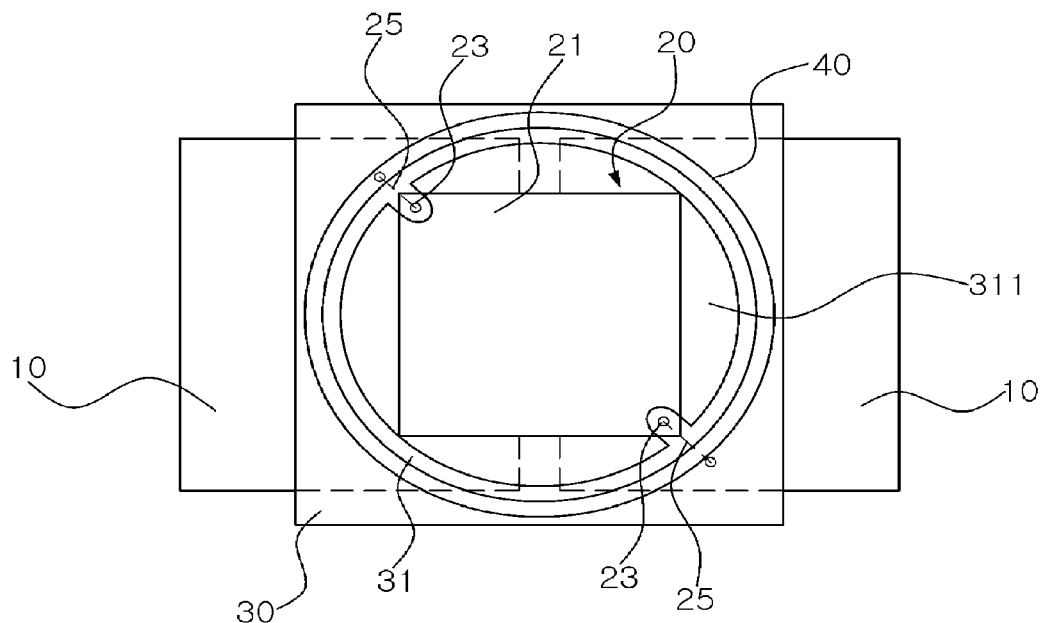
FIG. 3B illustrates a molding state of a body part shown in FIG. 3A.
Figure 4A:
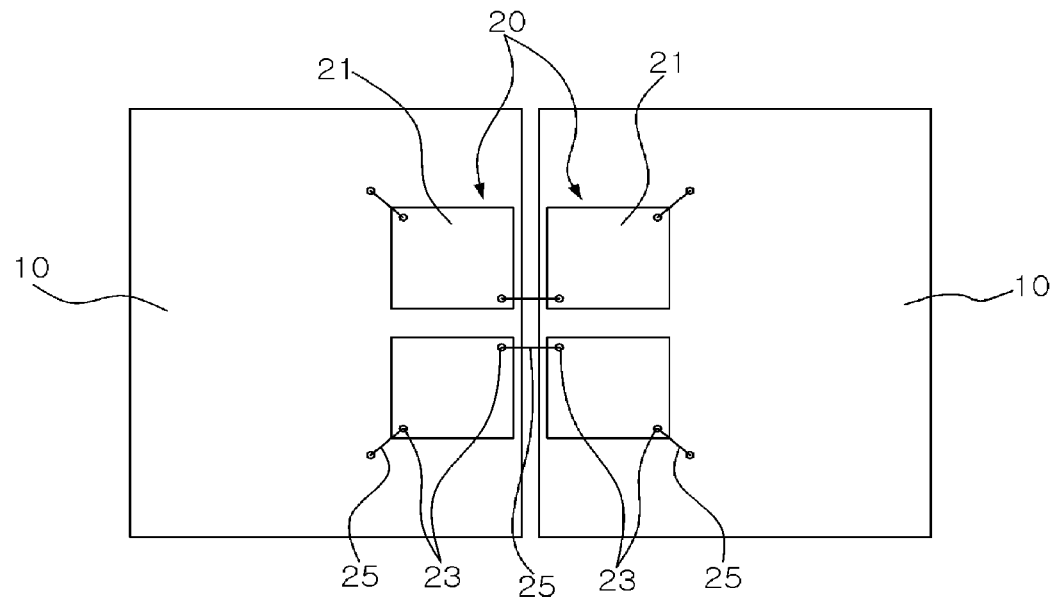
FIG. 4A illustrates a connection state of a plurality of light emitting devices shown in FIG. 3A.
Figure 4B:
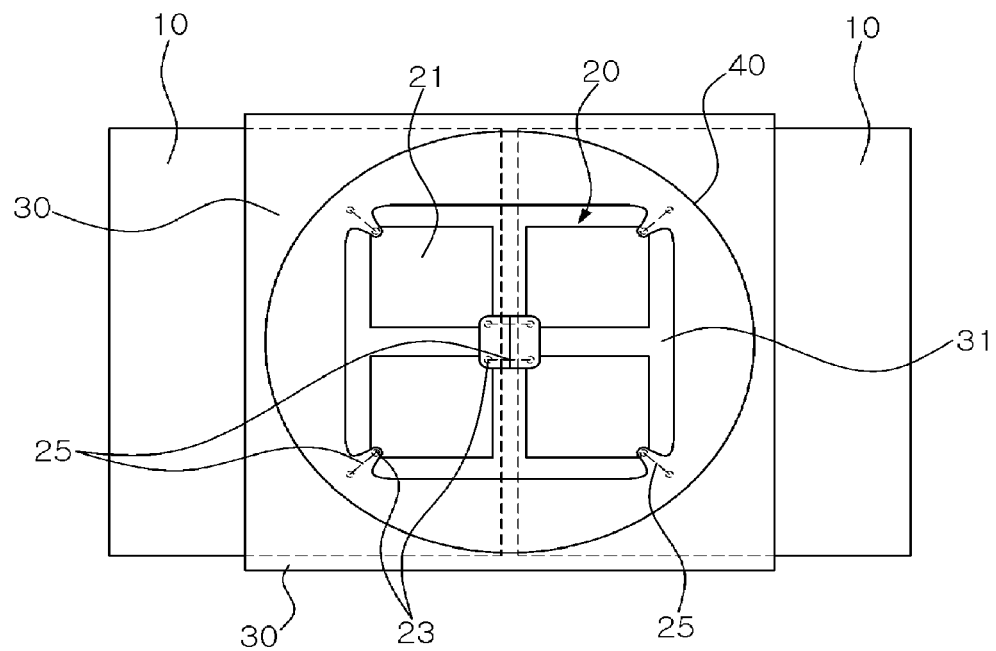
FIG. 4B illustrates a molding state of a body part shown in FIG. 4A.

FIG. 1 is a cross-sectional view of a light emitting device package according to an embodiment of the present invention, and FIGS. 2A and 2B are cross-sectional views of a light emitting device package according to another embodiment of the present invention. FIG. 3A is a plan view of a light emitting device disposed on the lead frames shown in FIG. 1 to be connected thereto using a bonding wire, and FIG. 3B illustrates a molding state of a body part shown in FIG. 3A. FIG. 4A illustrates a connection state of a plurality of light emitting devices shown in FIG. 3A and FIG. 4B illustrates a molding state of a body part shown in FIG. 4A.

Referring to FIGS. 1 and 2, according to an embodiment of the present invention, a light emitting device package 1 may include a plurality of lead frames 10, at least one light emitting device 20, a body part 30 and a lens part 40, and may further include a fluorescent substance layer 50 formed on the light emitting device and a heat dissipating unit 60 exposed to a lower part of an encapsulant part.

The lead frames 10 may be provided in plural and spaced apart from each other so as not to be electrically connected. FIG. 1 shows two lead frames as an example, but the present invention is not limited thereto. Three lead frames may be disposed as shown in FIG. 2A. In this case, a lead frame 10' disposed between both lead frames 10 to be short-circuited may serve to have a function of a pad on which a light emitting device 20 is mounted. The lead frame 10 may transfer an electrical signal to the light emitting device 20 mounted thereon. The lead frame 10 may be formed of a metal material such as Al, Cu, or the like, having a prominent heat conductivity such that heat generated from the light emitting device 20 may be emitted to the outside. The lead frame 10 may include a plurality of through holes 11 formed to be penetrate therethrough, through which the body part 30 to be described below may be filled, including upper and lower surfaces of the lead frames 10, so as to have relatively more solid lead frames 10 within the body part 30.

The light emitting device 20 may be one of various kinds of semiconductor devices emitting light having a given wavelength in response to an electrical signal applied from the outside, and may be a light emitting chip or a light emitting device package having a light emitting device chip mounted therein. The light emitting device 20 may emit blue light, red light or green light depending on materials contained therein, and may emit white light.

The light emitting device 20 may emit light to the outside through a light emission surface 21 provided as an upper surface thereof as shown in FIGS. 3A and 4A, and on the same upper surface, a wire bonding pad 23 is provided to be electrically connected to the lead frame 10 through a bonding wire 25. The wire bonding pad 23 may be disposed in plural at an edge of the upper surface of the light emitting device 20.

The light emitting device 20 may be bonded to an upper surface of the lead frame 10 through a bonding member 70 that is disposed in a gap between the light emitting device 20 and the lead frame 10. The bonding member 70 may be formed of a tape type adhesive layer on the lead frames 10, and may also be formed as a paste type layer for the covering thereof using a spraying method, a printing method, a dispensing method, or the like. In this case, the tape or paste may have a high density as a heat conductive filler. Further, the light emitting device 20 may be directly bonded to the upper surface of the lead frame 10 through a metal bonding, and at this time, heat conductivity between the light emitting device 20 and the lead frame 10 may be relatively prominent. The light emitting device 20 may be mounted singly as shown in FIG. 3, arrayed in plural in a matrix structure as shown in FIG. 4, arrayed in a line or in various other kinds of structures. The light emitting devices 20 arrayed within a single package may be the same as each other or different from one another.

The body part 30 may be formed to encapsulate and support the light emitting device 20 and the lead frame 10, including the wire bonding pad 23 and the bonding wire 25. In detail, the body part 30 may be formed to encapsulate the bonding wire 25 and a side surface 22 of the light emitting device 20, and a portion of the upper surface of the light emitting device 20, including the wire bonding pad 23. That is, the light emitting device 20 and the bonding wire 25 may be encapsulated by the body part 30 having relatively prominent mechanical and physical properties, instead of using an encapsulant part having relatively deteriorated mechanical and physical properties according to the related art, thereby securing connection reliability therebetween.

A reflective groove 31 may be formed in an upper surface of the body part 30, to which the light emission surface 21 of the light emitting device 20 may be exposed. As shown in FIGS. 1 and 2, the reflective groove 31 may have a tapered cup-like structure, of which an inner side surface is downwardly tilted, that is, tilted toward the light emitting device 20. In addition, the reflective groove 31 may be formed higher than a height of the light emitting device 20 such that the light emitting device 20 may not be protruded over the upper surface of the body part 30. A bottom surface 311 of the reflective groove 31 may be formed to have a circular shape as shown in FIG. 3B, a square shape as shown in FIG. 4B, as well as a pentagonal or a hexagonal shape, or the like, in consideration of light reflection properties. In this case, only the light emission surface 21 as the upper surface of the light emitting device 20 may be exposed to the outside through the reflective groove 31, but a side surface of the light emitting device 20 may be molded within the body part 30 so as not to be exposed to the outside.

The lens part 40 may be disposed on the body part 30 to cover and protect the light emitting device 20. The lens part 40 may be formed of a transparent resin material so as to evenly discharge light emitted from the light emitting device 20 to the outside. The lens part 40 may be formed to have an upwardly convex dome shape to improve an orientation angle of emitted light as shown in the drawings, but is not limited thereto, and may be formed to have other various kinds of structures in consideration of orientation angle properties. The lens part 40 may be formed directly on the body part 30 through a molding method such as a compression molding, transfer molding or the like or through a porting method of using a dispenser; or may be manufactured through a separate process so as to be bonded to the upper surface of the body part 30 using an adhesive.

A fluorescent substance layer 50 containing at least one kind of fluorescent material may be formed on the light emission surface 21 of the light emitting device 20, by which a wavelength of light emitted from the light emitting device 20 may be converted into a wavelength of a desired color. For example, blue light may be converted in white light. As shown in the drawings, since in the light emitting device 20, only the light emission surface 21 may be exposed through the reflective groove 31, in the fluorescent substance layer 50 containing a fluorescent material, the fluorescent material may only be distributed on the light emission surface 21, thereby reducing a required quantity of high-cost fluorescent material. In addition, only the light emission surface 21 of the light emitting device 20 may be exposed through the reflective groove 31 such that the fluorescent substance layer 50 may only be formed on the light emission surface 21.

Meanwhile, as shown in FIG. 2B, the light emitting device package may further include an encapsulant part 42 that is disposed between the light emitting device 20 and the lens part 40 and formed within the reflective groove 31 to encapsulate the light emitting device 20. The encapsulant part 42 may be formed of a transparent resin in a manner similar to that of the lens part 40 so as to smoothly discharge light emitted from the light emitting device 20 to the outside. The encapsulant part 42 and the lens part 40 may be formed of materials having the same refraction rate, and may also be formed of materials having different refraction rates in order to control an orientation angle of emitted light. In this case, the encapsulant part 42 may have a refraction rate lower than that of the lens part 40. The encapsulant part 42 may contain a fluorescent material so as to convert a wavelength of light generated in the light emitting device 20 into a required wavelength. In this case, the fluorescent material contained in the encapsulant part 42 may be different from the fluorescent material contained in the fluorescent substance layer 50, or the fluorescent substance layer 50 may not be formed. The encapsulant part 42 may contains a diffusion material to diffuse light in addition to the fluorescent material and also contains a mixture of fluorescent material and light diffusion material.

The heat dissipating unit 60 may be disposed in a lower part of the light emitting device 20, to be exposed to a lower part of the body part 30 so as to discharge heat produced by the light emitting device 20 to the outside. The heat dissipating unit 60 may be bonded to a lower surface of the lead frame 10 as the surface opposite to an upper surface of the lead frame 10 on which the light emitting device 20 is mounted, through the bonding member 70, or may be directly bonded to the lead frame 10 through eutectic bonding. The heat dissipating unit 60 may be formed of a metal or a ceramic material so as to enhance light emission efficiency or formed of a heat conductive silicon material.

Figure 5:
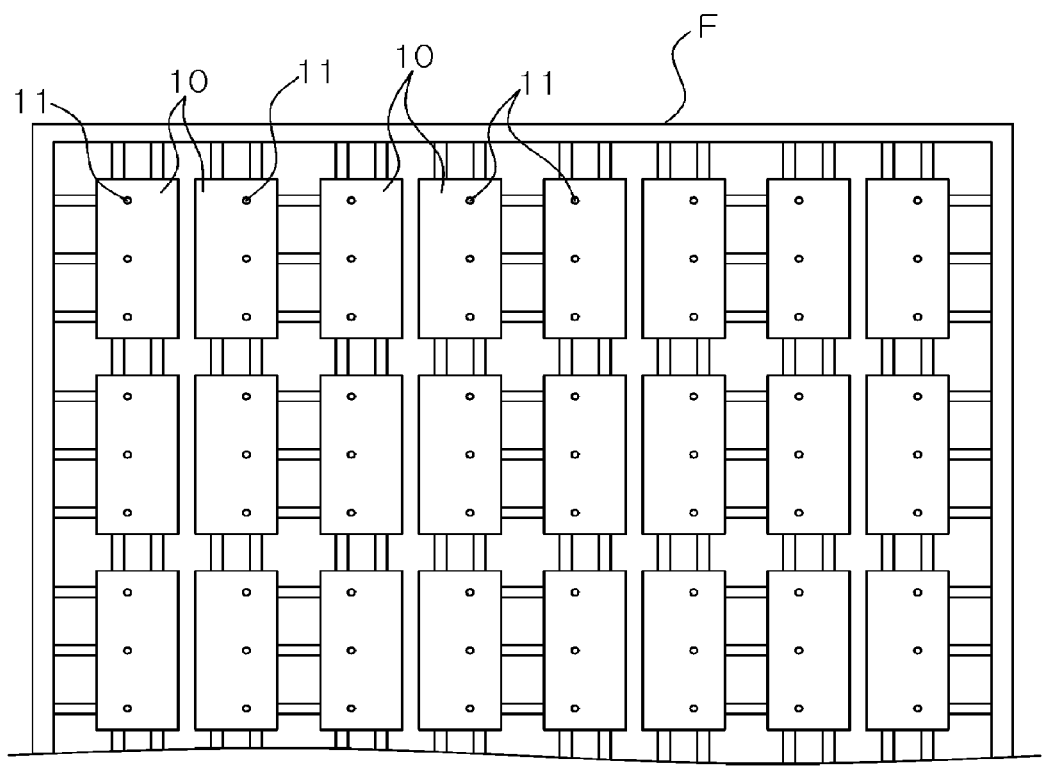
FIG. 5 illustrates a frame sheet on which a plurality of lead frames are patterned.
Figure 6A:
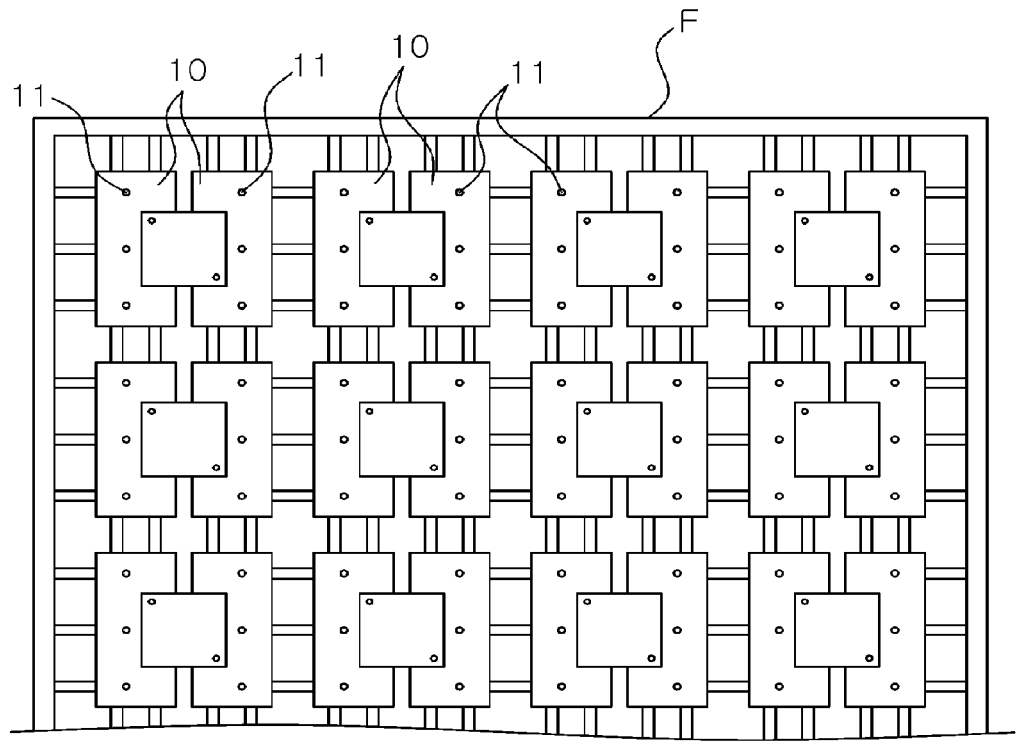
FIGS. 6A and 6B illustrate an embodiment of a light emitting device mounted on the lead frames shown in FIG. 5.
Figure 6B:
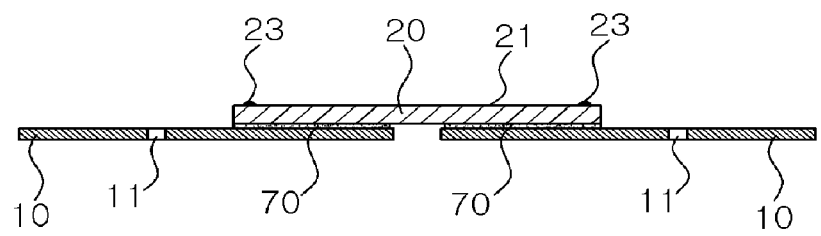
Figure 7:
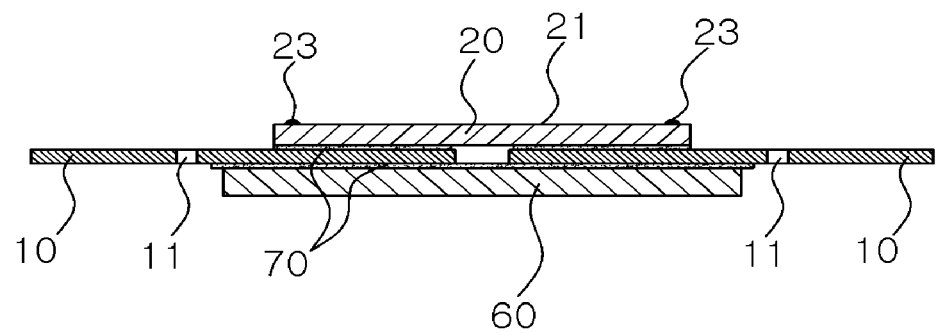
FIG. 7 illustrates an adhesion method of a heat emission unit in the configuration referred to in FIG. 6.
Figure 8A:
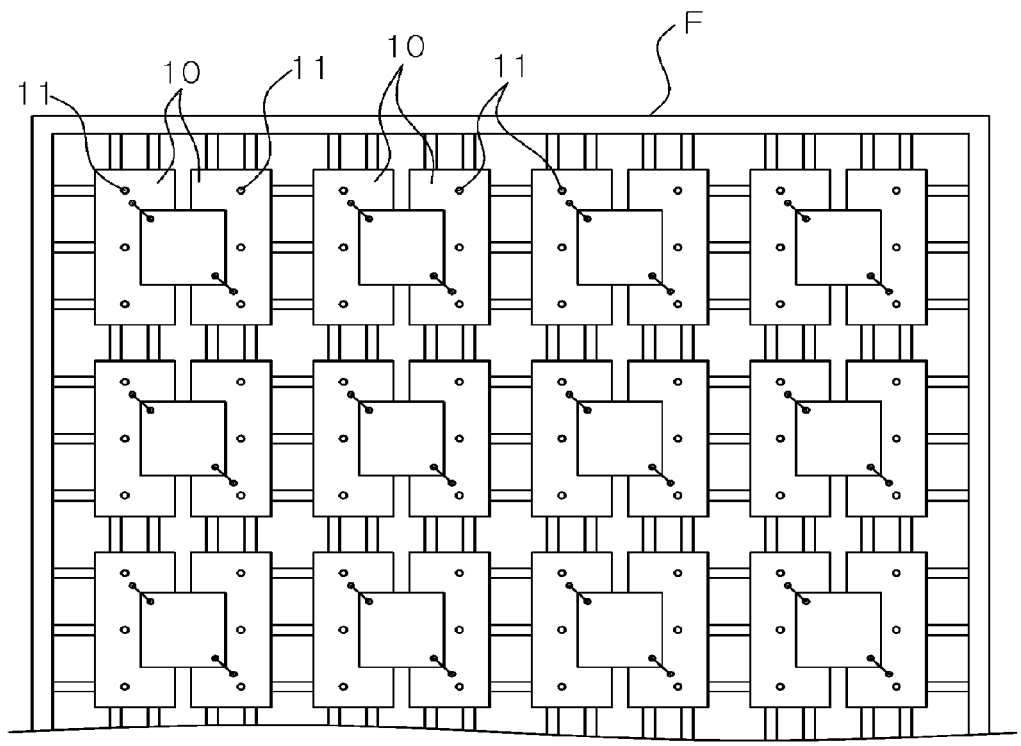
FIGS. 8A and 8B illustrate a connection state between the light emitting devices and the lead frames shown in FIG. 7 by way of bonding wires.
Figure 8B:
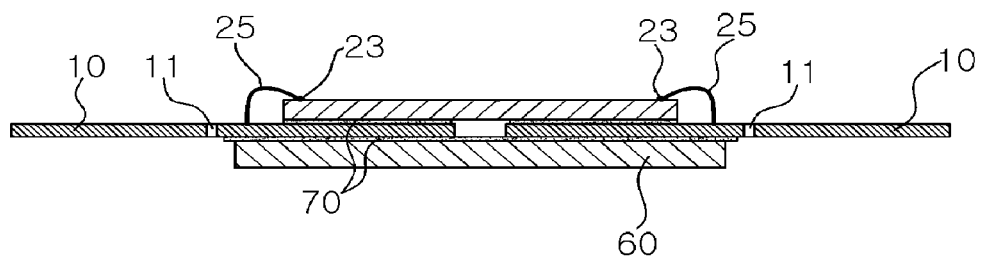
Figure 9:
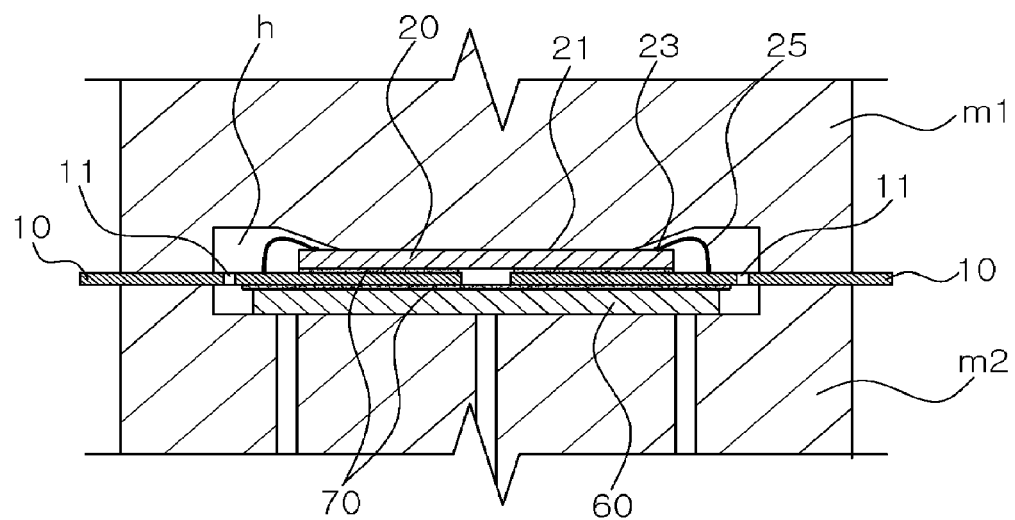
FIG. 9 illustrates an instance in which the lead frames are provided to have the light emitting device and the heat emission unit of FIG. 8 bonded therewith are disposed within a mold.
Figure 10A:
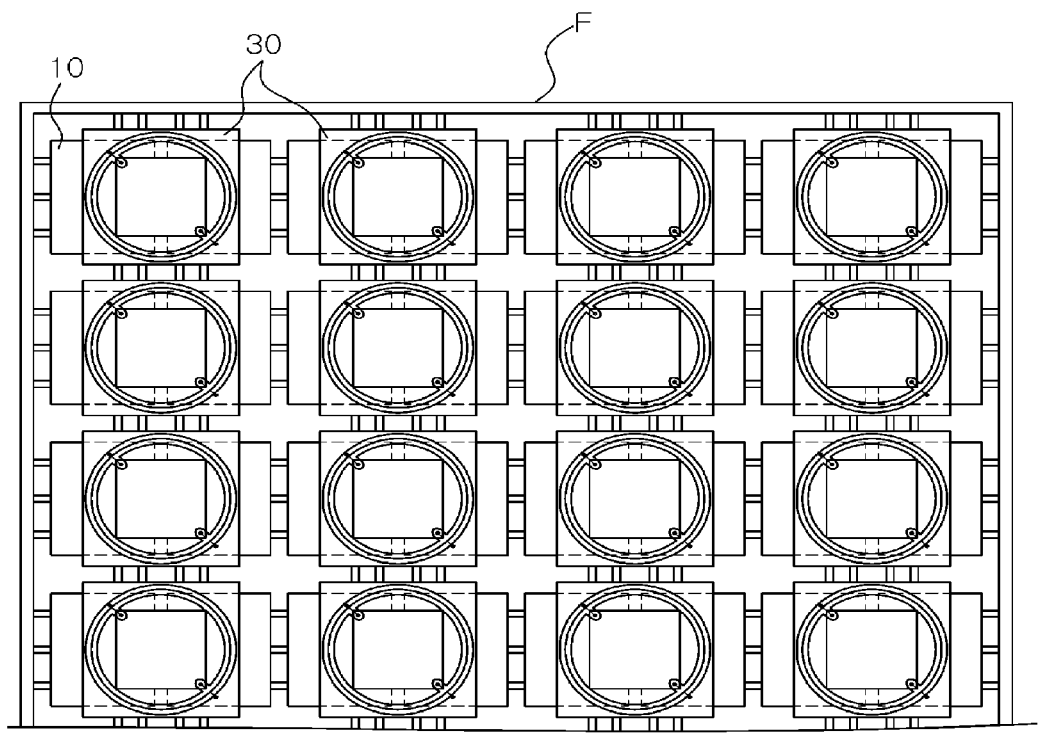
FIGS. 10A and 10B illustrate a molding process for forming a body part by injecting a resin into the mold shown in FIG. 9.
Figure 10B:
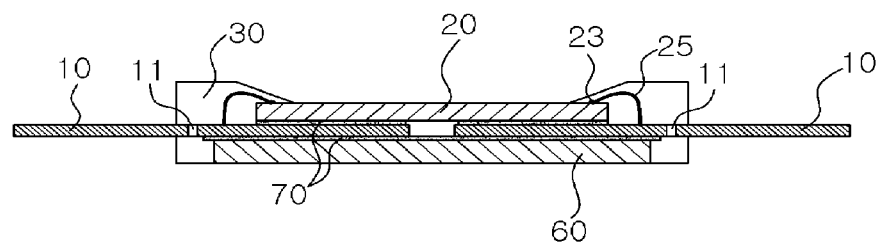
Figure 11:
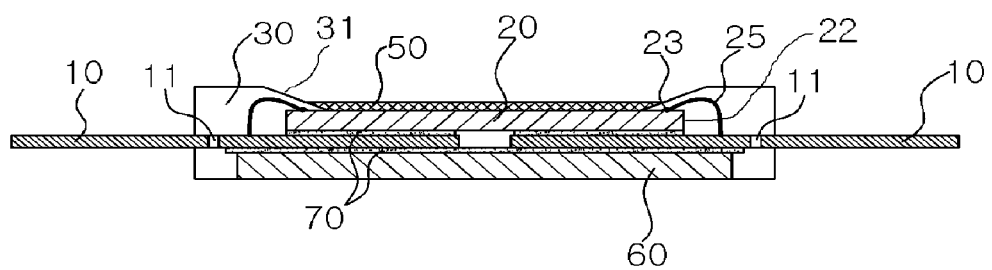
FIG. 11 is a cross-sectional view of a fluorescent substance layer within a reflective groove of the body part shown in FIG. 10.
Figure 12:
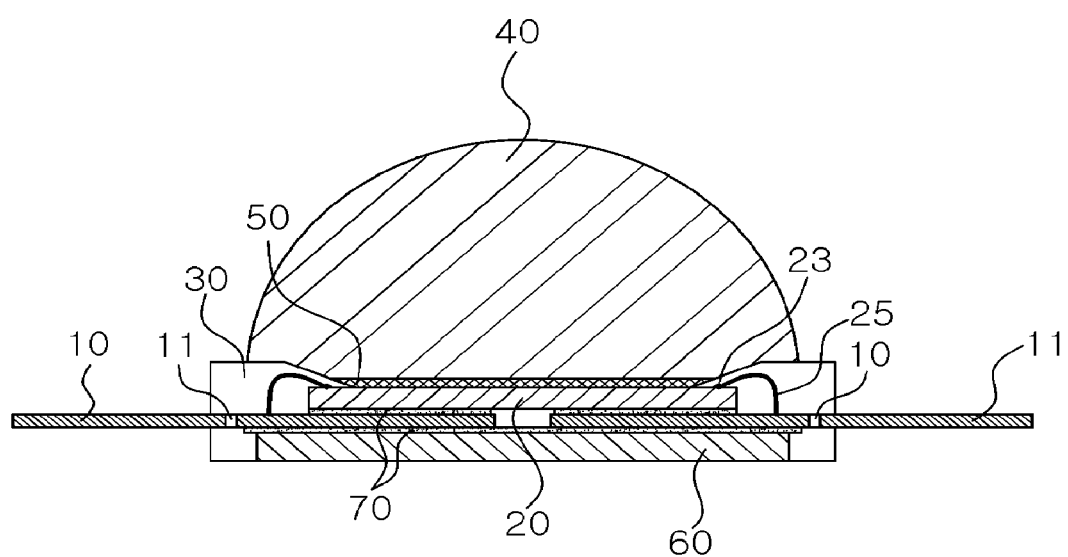
FIG. 12 is a cross-sectional view of a lens part disposed on the body part shown in FIG. 11.
Figure 13:
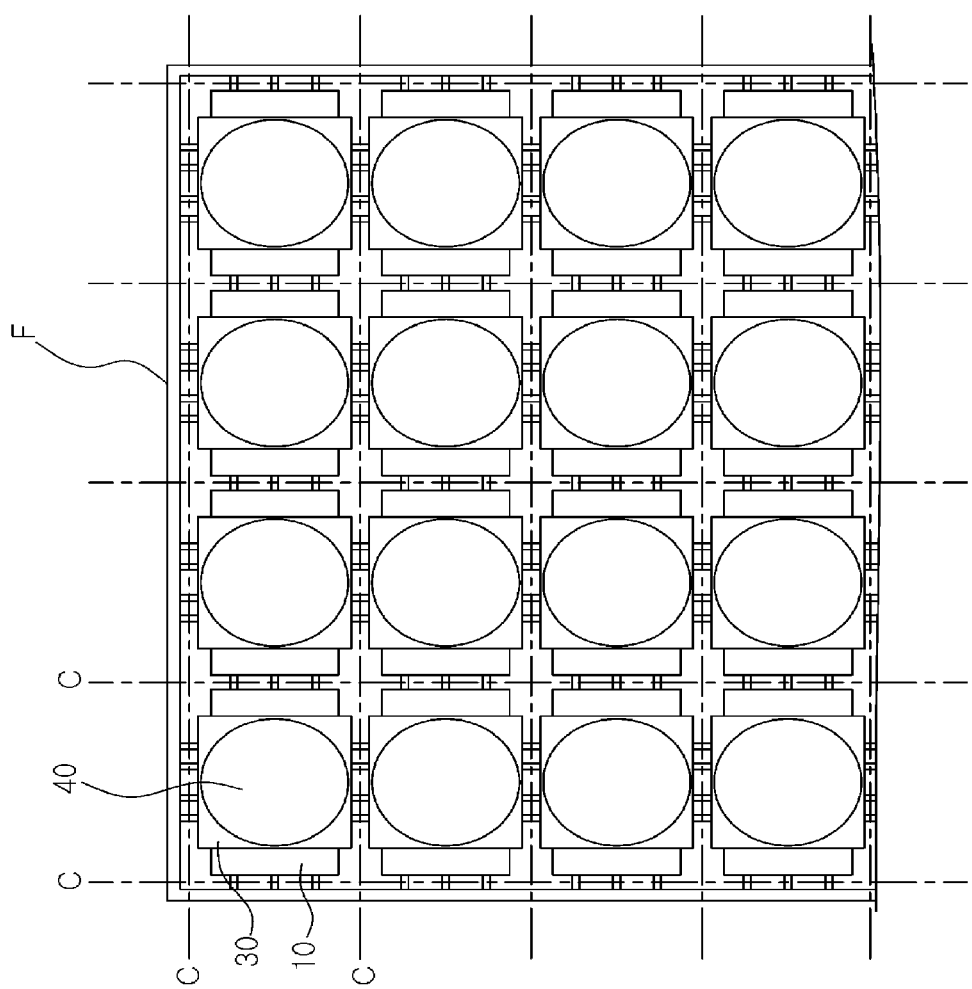
FIG. 13 is a plan view for a dicing operation to be performed along a cutting line in order to be separated into respective light emitting device packages.
Figure 14:
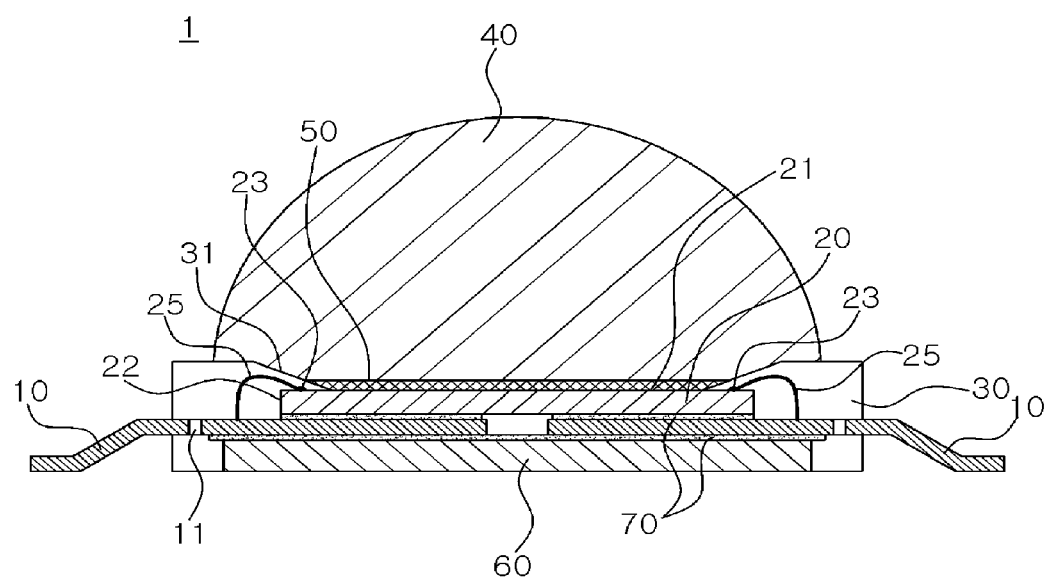
FIG. 14 is a cross-sectional view illustrating respectively separated light emitting device packages shown in FIG. 13, of which an end part of each lead frame thereof is bent.

A method of manufacturing a light emitting device package according to an embodiment of the present invention will be described with reference to FIGS. 5 to 14. FIG. 5 illustrates a frame sheet on which a plurality of lead frames are patterned, and FIGS. 6A and 6B illustrate an instance in which a light emitting device is mounted on the lead frames shown in FIG. 5. FIG. 7 illustrates an adhesive state of a heat emission unit in the configuration referred to in FIG. 6, and FIGS. 8A and 8B illustrate a connection state between the light emitting devices and the lead frames shown in FIG. 7 by way of bonding wires. FIG. 9 illustrates an instance in which the lead frames provided to have the light emitting device and the heat emission unit of FIG. 8 bonded therewith are disposed within a mold, and FIGS. 10A and 10B illustrate a molding process of forming a body part by injecting a resin into the mold shown in FIG. 9. FIG. 11 is a cross-sectional view of a fluorescent substance layer within a reflective groove of the body part shown in FIG. 10, and FIG. 12 is a cross-sectional view of a lens part disposed on the body part shown in FIG. 11. FIG. 13 is a plan view for a dicing operation to be performed along a cutting line in order to be separated into respective light emitting device packages, and FIG. 14 is a cross-sectional view illustrating respectively separated light emitting device packages shown in FIG. 13, of which an end part of each lead frame thereof is bent.

Referring to FIGS. 6A and 6B, a light emitting device, 20 having a wire bonding pad 23, disposed on the same surface as the light emission surface 21 as the upper surface of the light emitting device 20 may be prepared, and at least one light emitting device 20 may be then mounted on a plurality of lead frames 10 disposed to be spaced apart from one another.

The light emitting device 20 may be obtained by singulating a light emitting laminate having an n-type semiconductor layer, an active layer and a p-type semiconductor layer sequentially grown through a chemical vapor deposition apparatus (not shown) and the like into separate dies on a wafer level.

Meanwhile, the method of manufacturing a light emitting device package may further include arranging a frame sheet F on which the plurality of lead frames 10 are formed before the mounting of the light emitting device 20. In detail, the plurality of lead frames 10 may be formed to be separated from one another by a predetermined interval by performing repeated patterning on a metal plate formed of a material having relatively large electrical conductivity and heat conductivity properties as shown in FIG. 5. The lead frame 10 may have a plurality of through holes 11 penetrating therethrough. The light emitting devices 20 may be arrayed corresponding to the patterned lead frames 10, in series or in a unit of groups in which the plurality of light emitting devices in a matrix type form a group, as shown in FIG. 6. By this array structure the light emitting devices may be mass produced.

Subsequently, the heat dissipating unit 60 may be bonded to lower surfaces of the lead frames 10 on which the light emitting device 20 is mounted, such that the heat dissipating unit may be disposed at a lower part of the light emitting device 20, as shown in FIG. 7. The heat dissipating unit 60 may be bonded to the lead frame 10 through the bonding member 70 as shown in the drawings or may be directly bonded to the lead frame 10 through the eutectic bonding. The drawings show that the heat dissipating unit 60 may be bonded to the lower surfaces of the lead frames 10 after the light emitting device 20 is mounted on the lead frames 10, but is not limited thereto, and the light emitting device 20 may be mounted on the lead frames 10 after the heat dissipating unit 60 is bonded to the lower surface of the lead frame 10. The light emitting device 20 and the heat dissipating unit 60 may be simultaneously bonded to the upper and lower surfaces of the lead frames 10.

Then, as shown in FIGS. 8A and 8B, one end of the bonding wire 25 may be bonded to the wire bonding pad 23, and another end thereof may be bonded to the lead frame 10 to electrically connect the light emitting device 20 to the lead frame 10.

Subsequently, as shown in FIG. 9, the light emitting device 20 mounted on the lead frames 10 to be connected thereto through the bonding wire 25, and the heat dissipating unit 60 bonded to the lower surfaces of the lead frame 10, may be positioned to be fixed within a molding space h of molds m1 and m2, and in this fixed state, a resin may be injected into the molding space h, thereby manufacturing the body part 30 encapsulating the light emitting device 20 mounted on the lead frames together with the boding wire 25 in one body as shown in FIGS. 10A and 10B. This molding process may be performed to form the reflective groove 31 in an upper surface of the body part 30 so as to expose the light emission surface 21 of the light emitting device 20 therethrough, and performed to expose the heat dissipating unit 60 through a lower surface of the body part 30. According to the array scheme of the light emitting devices 20 mounted on the lead frames 10, one light emitting device 20 may be disposed in the reflective groove 31 and molded to provide a single chip package structure, or a plurality of light emitting devices 20 may be disposed therein and molded to provide a multichip package structure.

The body part 30 may be formed to encapsulate the bonding wire 25, the side surface 22 of the light emitting device 20, and a portion of the upper surface of the light emitting device 20, including the wire bonding pad 23, through the molding process as shown in FIGS. 10A and 10B. Since the encapsulating may be performed to cover the side surface 22 of the light emitting device 20 and a portion of the upper surface thereof on which the wire bonding pad 23 is formed, only the light emission surface 21 of the light emitting device 20 may be exposed to the outside through the reflective groove 31 of the body part 30.

As described above, in a post molding method of forming the body part 30 after the light emitting device 20 is mounted on the lead frames 10 and the wire bonding process is completed, an overall process may be simplified since a non-value added process, such as baking and the like before introducing resin material, is omitted, unlike in a pre-molding method of mounting a light emitting device in a state in which the existing body part has been formed and of performing a wire bonding process. In addition, the molding process may be performed by controlling the structure of the reflective groove 31 to control a degree of exposure of the light emitting device 20, that is, only an upper surface thereof may be exposed, thereby preventing an unnecessary waste of space and significantly facilitating miniaturization and light collection efficiency.

Then, with reference to FIG. 11, the fluorescent substance layer 50 may be formed on the light emission surface 21 of the light emitting device 20. The fluorescent substance layer 50 may contain at least one kind of fluorescent material so as to convert a wavelength of light emitted from the light emitting device 20 into a wavelength of a required color. In particular, since only the light emission surface 21 of the light emitting device 20 is exposed to the outside through the reflective groove 31, the fluorescent substance layer 50 containing the fluorescent material may distribute the fluorescent material onto only the light emission surface 21 so as to reduce the amount of high-priced fluorescent material required. In addition, since in the body part, only the light emission surface 21 of the light emitting device 20 is exposed through the reflective groove 31, the fluorescent substance layer 50 may be facilitated to be formed on the light emission surface 21 only. Moreover, the fluorescent substance layer 50 may be formed by injecting a resin containing a fluorescent material into a bottom surface of the reflective groove 31 and then hardening the injected resin, by depositing the resin thereon through a spraying or printing method or the like, or by being bonded as a thin film state.

Next, the lens part 40 may be formed on the body part 30 as shown in FIG. 12. The lens part 40 may be formed to have an upwardly convex dome shape to improve an orientation angle of emitting light, but is not limited thereto. The lens part 40 may be formed directly on the body part 30 using a molding method such as compression molding or transfer molding or the like, or a porting method using a dispenser, or may be manufactured through a separate process and bonded to the body part 30 using an adhesive.

Then, a plurality of light emitting device packages may be manufactured by dicing along a cutting line C shown in FIGS. 13 and 14 so as to separate light emitting device packages and then bending end parts of the lead frames 10 of the respective light emitting device packages.

As set forth above, according to an embodiment of the present invention, a molding material prominent in mechanical and physical properties is used for the package body including a chip and wires in the encapsulating process, thereby enhancing bonding reliability between the wire and chip even in high temperature and humidity operating environment.

Furthermore, since in a general epi-up (eg, p-side up) chip, light is also emitted from a side surface of a growth substrate, a fluorescent layer should be applied to cover not only an upper part of chip but a side surface thereof; however, according to an embodiment of the present invention, a fluorescent layer may be formed only on an upper part of chip by using a light reflection mold material encapsulating the periphery of the chip, thereby relatively easily forming a fluorescent layer and implementing light having a uniform color quality.

Further, according to an embodiment of the present invention, since the molding process is performed after chip bonding and wire bonding processes, a non-value added process such as bake processing and the like before introducing molding material may be omitted, thereby simplifying an overall process.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing a light emitting device package, the method comprising:
preparing a light emitting device provided with a wire bonding pad attached to the same surface as a light emission surface provided as an upper surface of the light emitting device;
mounting at least one light emitting device on a plurality of lead frames disposed to be separated from one another;
electrically connecting the light emitting device to the lead frames by bonding one end of the bonding wire to the wire bonding pad and bonding the other end thereof to the lead frame;
forming a body part through a molding process to encapsulate the light emitting device mounted on the lead frames together with the bonding wires by injecting a resin into a mold, the body part being formed to have a reflective groove formed in an upper surface thereof to expose the light emission surface therethrough; and
forming a lens part on the body part to cover the light emitting device.

2. The method of claim 1, further comprising arranging a frame sheet on which the plurality of lead frames are formed to be separated from one another, before the mounting of the light emitting device.

3. The method of claim 1, further comprising bonding a heat dissipating unit to lower surfaces of the lead frames on which the light emitting device is mounted, such that the heat dissipating unit is disposed at a lower part of the light emitting device, before the forming of the body part, the heat dissipating unit being exposed to a lower part of the body part to be formed later.

4. The method of claim 1, wherein the forming of the body part is performed to encapsulate the bonding wire and a side surface of the light emitting device, and a portion of the upper surface of the light emitting device, including the wire bonding pad, through the molding process.

5. The method of claim 1, wherein the forming of the body part is performed to dispose a single light emitting device in the reflective groove or a plurality of light emitting devices therein through the molding process.

6. The method of claim 1, further comprising forming a fluorescent substance layer on the light emission surface of the light emitting device between the forming of the body part and the forming of the lens part.

7. The method of claim 1, further comprising dicing along a cutting line so as to be separated into separate light emitting device packages.

* * * * *